US012768895B2

(12) United States Patent
Kinoshita et al.

(10) Patent No.: US 12,768,895 B2
(45) Date of Patent: Oct. 20, 2026

(54) GAS DETECTION METHOD AND GAS DETECTION DEVICE

(71) Applicants: Osaka Gas Co., Ltd., Osaka (JP); KRI, INC., Kyoto-shi (JP)

(72) Inventors: Hajime Kinoshita, Kyoto (JP); Mayumi Kuriyama, Kyoto (JP)

(73) Assignees: Osaka Gas Co., Ltd., Osaka (JP); KRI, INC., Kyoto (JP)

( * ) Notice: Subject to any disclaimer, the term of this patent is extended or adjusted under 35 U.S.C. 154(b) by 144 days.

(21) Appl. No.: 18/692,613

(22) PCT Filed: Feb. 16, 2023

(86) PCT No.: PCT/JP2023/005446

§ 371 (c)(1),
(2) Date: Mar. 15, 2024

(87) PCT Pub. No.: WO2023/176288

PCT Pub. Date: Sep. 21, 2023

(65) Prior Publication Data

US 2024/0426928 A1 Dec. 26, 2024

(30) Foreign Application Priority Data

Mar. 18, 2022 (JP) ................................ 2022-043908

(51) Int. Cl.

*G01R 31/389* (2019.01)
*G01R 31/3842* (2019.01)
*G01R 31/392* (2019.01)

(52) U.S. Cl.

CPC ....... *G01R 31/389* (2019.01); *G01R 31/3842* (2019.01); *G01R 31/392* (2019.01)

(58) Field of Classification Search

None
See application file for complete search history.

(56) References Cited

U.S. PATENT DOCUMENTS

| | | | |
|---|---|---|---|
| 4,745,349 A | 5/1988 | Palanisamy et al. | |
| 2001/0035740 A1 | 11/2001 | Palanisamy | |
| 2011/0169454 A1 | 7/2011 | Maruyama et al. | |
| 2017/0005305 A1* | 1/2017 | Harris | H01M 10/6557 |
| 2022/0099749 A1* | 3/2022 | Wang | G01L 9/00 |

FOREIGN PATENT DOCUMENTS

| | | |
|---|---|---|
| JP | 1092473 A | 4/1998 |
| JP | 2009201336 A | 9/2009 |
| JP | 201389311 A | 5/2013 |

* cited by examiner

*Primary Examiner* — Jas A Sanghera
(74) *Attorney, Agent, or Firm* — The Webb Law Firm

(57) ABSTRACT

The method includes a preparation step of changing a current value or a voltage value of a power storage device; a first measurement step of obtaining a first internal resistance that is an internal resistance when a predetermined first period of time has elapsed from start of change in the current value or the voltage value in the preparation step; a second measurement step of obtaining a second internal resistance that is an internal resistance when a second period of time has elapsed from the start of change in the current value or the voltage value in the preparation step; a calculation step of calculating a resistance value difference by subtracting the first internal resistance from the second internal resistance; and a detection step of detecting generation of gas inside the power storage device based on the resistance value difference.

12 Claims, 7 Drawing Sheets

Fig.4

| | | | R1 | | R2 | | RG | ΔRG | | |
|---|---|---|---|---|---|---|---|---|---|---|
| CYCLE TIME | CONFIRMED CAPACITY | AMOUNT OF GAS | R1 | Δ R1 | R60 | Δ R60 | R60−R1 | Δ (R60−R1) | BULK RESISTANCE | REACTION RESISTANCE |
| WEEK | mAh | cc | mΩ | mΩ | mΩ | mΩ | mΩ | mΩ | mΩ | mΩ |
| 0 | 2211 | 0 | 68.8 | 0.0 | 92.4 | 0.0 | 23.6 | 0.0 | 57.7 | 26.4 |
| 1 | 2107 | 0.01 | 73.8 | 5.0 | 95.5 | 3.1 | 21.7 | −1.9 | 56.6 | 42.8 |
| 2 | 2051 | 0.02 | 78.7 | 9.9 | 101.1 | 8.7 | 22.4 | −1.2 | 58.9 | 43.0 |
| 3 | 1997 | 0.05 | 82.8 | 14.0 | 106.5 | 14.1 | 23.7 | 0.1 | 58.7 | 52.3 |
| 5 | 1889 | 0.17 | 91.7 | 22.9 | 119.6 | 27.2 | 27.9 | 4.3 | 60.6 | 69.0 |
| 7 | 1757 | 0.21 | 103.4 | 34.6 | 140.2 | 47.8 | 36.8 | 13.2 | 61.8 | 92.5 |
| 10 | 1575 | 0.28 | 128.4 | 59.6 | 167.6 | 75.2 | 39.2 | 15.6 | 63.6 | 109.3 |
| 14 | 1399 | 0.36 | 185.8 | 117.0 | 259.3 | 166.9 | 73.5 | 49.9 | 66.4 | 169.7 |

GAS DETECTION METHOD AND GAS DETECTION DEVICE

CROSS-REFERENCE TO RELATED APPLICATIONS

This application is the United States national phase of International Patent Application No. PCT/JP2023/005446 filed Feb. 16, 2023, and claims priority to Japanese Patent Application No. 2022-043908 filed Mar. 18, 2022, the disclosures of which are hereby incorporated by reference in their entireties.

BACKGROUND OF THE INVENTION

Field of the Invention

The present invention relates to a gas detection method and a gas detection device for detecting gas generated in a secondary battery.

Description of Related Art

Lithium-ion battery (LIB) business has rapidly grown under constant development of technologies for reducing the size and weight of portable devices and improving functions (increasing convenience) thereof, for example, due to the high energy density, high voltage, and safety of lithium-ion batteries. Since global environmental issues and natural resource issues are nowadays attracting attention, the lithium-ion battery market is expected to keep growing accompanying promoted use of eco-cars and policy changes to renewable energies, for example. On the other hand, if lithium-ion batteries are applied to electric vehicles (EVs) and stationary power storage systems (e.g., standardization of renewable energies), it is expected that, in 2030, the required amount of lithium-ion batteries will be about ten times that in 2018, and there is a concern that the battery cost will rapidly increase due to lack of resources, for example.

As a method for solving these problems, reuse (secondary use) of batteries (secondary batteries/power storage devices) such as lithium-ion batteries and sharing of EVs have been proposed, for example. In order to realize such reuse and sharing, technologies for increasing the service life to use the same battery for a long period of time are necessary. As approaches to increase the service life of a battery, it is conceivable to increase the service life of the battery itself (the design of the battery) and increase the service life of the battery by effectively using the battery (the manner of use of the battery). Although the latter approach includes many techniques such as cooling the battery, controlling heating and charge current when charging the battery at low temperatures, and controlling a charge-discharge range of the battery, there is demand for a technique for sensing SOH (State of Health) of the battery, which changes depending on a use history (over time), and controlling the battery in accordance with its current state (SOH) to prevent deterioration of the battery.

SOC (State of Charge) or the battery capacity (capacity deterioration) calculated from the temperature and measurement results of the current, voltage, and time is currently used as SOH, and an internal resistance of the battery is also used in some cases.

When a side reaction occurs in a battery, gas is generated in most cases before the battery capacity deteriorates. When gas is generated, the internal pressure of a battery jar of the battery starts to increase. If the gas cannot be released well or the battery jar cannot expand sufficiently (a large battery is used while being bound), the gas is stored between electrodes, and accordingly, a reaction cannot take place uniformly in the battery (the reaction occurs non-uniformly) and secondary deterioration that involves a rapid capacity reduction occurs. If whether or not gas is generated and gas generating conditions are added to SOH and the battery is controlled in accordance with SOH to prevent deterioration, the service life of the battery can be increased. As a method for detecting gas, it is conceivable to use a method of directly measuring the pressure of gas inside the battery or a method of sensing the internal pressure of a battery pack, for example. Also, Patent Document 1 discloses a method for detecting the generation of gas by measuring AC impedance, and Patent Document 2 discloses a method for detecting the generation of gas from a voltage change based on resistance during charging.

Patent Documents

Patent Document 1: JP H10-92473A
Patent Document 2: JP 2013-89311A

However, in the above-described method of directly measuring the pressure of gas inside the battery and the above-described method of measuring the internal pressure of the battery pack, it is necessary to use a gas sensor, a pressure sensor, or the like, and it is difficult to easily detect gas. Also, in the above-described method for detecting the generation of gas from AC impedance, a large device is required, and it is not possible to easily detect the generation of gas. Also, in the method for detecting the generation of gas from a voltage change based on resistance, complex processing is required to detect gas, and it is not possible to easily detect the generation of gas.

SUMMARY OF THE INVENTION

In order to solve the above-described problems, an object of the present invention is to precisely detect the generation of gas in a power storage device with an easy practical method.

In order to achieve the above object, a gas detection method according to an embodiment of the present invention has a characteristic configuration including: a preparation step of changing a current value or a voltage value of a power storage device; a first measurement step of obtaining a first internal resistance that is an internal resistance when a predetermined first period of time has elapsed from start of change in the current value or the voltage value in the preparation step; a second measurement step of obtaining a second internal resistance that is an internal resistance when a second period of time has elapsed from the start of change in the current value or the voltage value in the preparation step, the second period of time being longer than the first period of time by at least a predetermined period of time; a calculation step of calculating a resistance value difference by subtracting the first internal resistance from the second internal resistance; and a detection step of detecting generation of gas inside the power storage device based on the resistance value difference.

This configuration makes it possible to easily confirm the generation of gas by analyzing time dependency of the internal resistance, and precisely detect the generation of gas in the power storage device with an easy practical method.

The current value or the voltage value may be changed in the preparation step by stopping charging while the power storage device is charged or by stopping discharging while the power storage device is discharged.

This configuration makes it possible to easily and stably perform the preparation step, and precisely detect the generation of gas in the power storage device with an easy practical method.

When the resistance value difference is larger than a predetermined threshold determined in advance, it may be determined in the detection step that the gas has been generated.

This configuration makes it possible to easily detect the generation of gas.

A detection cycle including the preparation step, the first measurement step, the second measurement step, the calculation step, and the detection step may be carried out intermittently, and in each detection step, when the resistance value difference is larger than a predetermined threshold determined in advance, it may be determined in the detection step that the gas has been generated.

This configuration makes it possible to easily detect the generation of gas.

In each detection step, the threshold may be calculated based on the resistance value difference calculated in an immediately preceding detection cycle or a detection cycle earlier than the immediately preceding detection cycle.

This configuration makes it possible to easily determine time dependency of the resistance value difference, and precisely detect the generation of gas in the power storage device with an easy practical method.

The threshold may be the resistance value difference in the first detection cycle.

This configuration makes it possible to more easily and precisely determine time dependency of the resistance value difference, and precisely detect the generation of gas in the power storage device with an easy practical method.

A detection cycle including the preparation step, the first measurement step, the second measurement step, the calculation step, and the detection step may be carried out intermittently, and in each detection step, when a value obtained by subtracting the resistance value difference calculated in the first detection cycle from the resistance value difference calculated in the detection cycle is larger than 0, it may be determined in the detection step that the gas has been generated.

This configuration makes it possible to more easily and precisely determine time dependency of the internal resistance, and precisely detect the generation of gas in the power storage device with an easy practical method.

The second period of time may be set to a period of time in which the internal resistance becomes a predetermined value that is 80% or more of an internal resistance in a steady state after the preparation step is started.

This configuration makes it possible to appropriately set the second period of time, and precisely detect the generation of gas in the power storage device.

The first period of time may be set to a period of time in which the internal resistance becomes a predetermined value that is 10% or more and 40% or less of the internal resistance in the steady state after the preparation step is started.

This configuration makes it possible to appropriately set the first period of time, and precisely detect the generation of gas in the power storage device.

The first period of time may be set to 10 milliseconds or more and 3 seconds or less, and the second period of time may be set to 5 seconds or more and 600 seconds or less.

This configuration makes it possible to appropriately set the first period of time and the second period of time, and precisely detect the generation of gas in the power storage device.

The preparation step, the first measurement step, the second measurement step, the calculation step, and the detection step may be carried out while the power storage device is kept in a predetermined temperature range.

This configuration makes it possible to detect gas with use of an appropriate first period of time, an appropriate second period of time, and appropriate determination conditions according to the temperature range, and precisely detect the generation of gas in the power storage device.

Furthermore, a gas detection device according to an embodiment of the present invention is configured to detect generation of gas in a power storage device that is chargeable and dischargeable, and the gas detection device has a characteristic configuration including: a current-voltage control unit configured to control at least a current value or a voltage value of the power storage device; a voltmeter configured to measure the voltage value of the power storage device; an ammeter configured to measure a current value of a current flowing through the power storage device; a resistance calculating unit configured to measure a first internal resistance that is an internal resistance of the power storage device and a second internal resistance that is an internal resistance of the power storage device, the first internal resistance being measured from: a change amount of the voltage value until a predetermined first period of time elapses from when the current value or the voltage value of the power storage device is changed; and a change amount of the current value when the current value or the voltage value is changed, the second internal resistance being measured from: a change amount of the voltage value until a second period of time longer than the first period of time by a predetermined period of time elapses from when the current value or the voltage value is changed; and the change amount of the current value when the current value or the voltage value is changed; and a detection unit configured to calculate a resistance value difference by subtracting the first internal resistance from the second internal resistance and detecting generation of gas inside the power storage device based on the resistance value difference.

This configuration makes it possible to easily confirm time dependency of the internal resistance resulting from the generation of gas, and precisely detect the generation of gas in the power storage device with an easy practical method.

BRIEF DESCRIPTION OF THE DRAWINGS

The terms Fig., Figs., Figure, and Figures are used interchangeably in the specification to refer to the corresponding figures in the drawings.

FIG. 4 is a table showing data obtained through an experiment.

DESCRIPTION OF THE INVENTION

In order to increase the service life of a power storage device (secondary battery) such as a lithium-ion battery 1 (see FIG. 2) and appropriately use the power storage device in accordance with conditions, SOH and the degree of deterioration of the power storage device are measured. Deterioration of the power storage device is affected by a combination of various causes.

As a method for determining deterioration of the power storage device, time dependency of internal resistance of the power storage device is used. The time dependency of internal resistance is determined by changing the voltage value or the current value of the power storage device and measuring the internal resistance of the power storage device when t1 seconds, which is set in advance, have elapsed from when the voltage value or the current value was changed. Based on the time dependency of internal resistance, deterioration of the power storage device is determined.

The internal resistance of the power storage device changes in response to a change in the voltage value or the current value of the power storage device, and converges to a constant value when a battery reaction enters a steady state. At this time, the resistance value corresponding to a time t is referred to as a "t-seconds resistance". The resistance varies depending on the device temperature, and increases as the device temperature decreases. Therefore, the internal resistance of the power storage device can be expressed as a function of time and temperature.

The time dependency of internal resistance of the power storage device is determined by phenomena (causes of deterioration) that cause the resistance. A resistance due to movement of electrons or ions appears relatively early, and a resistance due to a reaction (charge transfer) occurring at the surface of an electrode active material, dispersion, or equilibrium appears later. Although the time dependency depends on the type of power storage device, the active material, electrode configuration, temperature, etc., in the case of the lithium-ion battery 1, for example, the resistance due to movement of electrons or ions and the resistance due to the reaction occurring at the surface of an electrode active material are included in an internal resistance that appears within about 1 second when the temperature is 25° C.

When gas is generated inside the power storage device, the internal resistance of the power storage device increases. However, the correlation between the generation of gas and the internal resistance of the power storage device is not clear, and therefore, it has been difficult to directly detect the generation of gas with use of the internal resistance.

Figure 1:
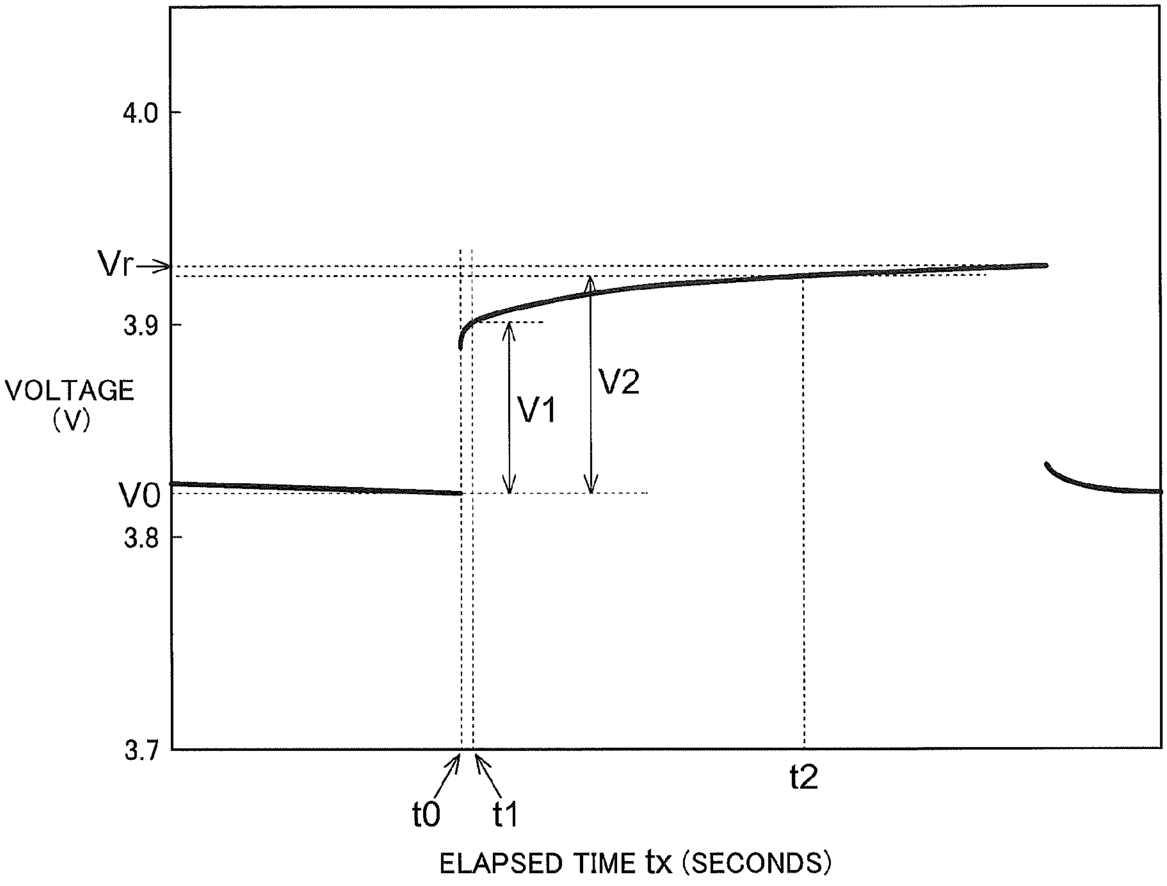
FIG. 1 is a diagram showing an example change of voltage over time when a voltage value or a current value is changed.

The inventors of the present invention found through intensive studies that there is a good correlation between a gas generation amount and a difference between two t-seconds resistances corresponding to different elapsed times tx (see FIG. 1). That is, the inventors of the present invention found that, when the voltage value or the current value of the power storage device is changed, it is possible to detect the generation of gas inside the power storage device based on R2−R1 where R1 (see FIG. 2, which will be described later) represents a first internal resistance (t1-seconds resistance) of the power storage device when a first period of time t1 seconds, which is an elapsed time tx set in advance, have elapsed from when the voltage value or the current value of the power storage device was changed, and R2 (see FIG. 2) represents a second internal resistance (t2-seconds resistance) of the power storage device when a second period of time t2 seconds (t1<t2), which is an elapsed time tx set in advance, have elapsed from when the voltage value or the current value was changed.

For example, as shown in FIG. 1, the voltage value or the current value is caused to start to change when the elapsed time is t0. When the voltage value or the current value is changed, the voltage of the power storage device sharply increases in an irregular manner, and thereafter gradually converges to a predetermined constant voltage Vr (steady state).

At this time, a voltage value V1 of the power storage device is measured when the elapsed time tx from the start of the change in the voltage value or the current value is a first period of time t1 that is longer than a period during which the voltage sharply increases. Also, a voltage value V2 of the power storage device is measured when the elapsed time tx is a second period of time t2 that is longer than the first period of time t1 by at least a predetermined period of time. Note that each of the voltage value V1 and the voltage value V2 is a potential difference from a voltage value V0 at the start of the change in the voltage value or the current value. That is, the voltage value V1 is a change amount of the voltage value until the first period of time t1 elapses from the start of the change in the voltage value or the current value, and the voltage value V2 is a change amount of the voltage value until the second period of time t2 elapses from the start of the change in the voltage value or the current value.

Furthermore, the first internal resistance R1 corresponding to the first period of time t1 and the second internal resistance R2 corresponding to the second period of time t2 are calculated from a change amount ΔI of the current value when the voltage value or the current value was changed, the voltage value V1, and the voltage value V2 with use of the Ohm's law. That is, the first internal resistance R1 is calculated by dividing the voltage value V1 by the change amount ΔI of the current value (R1=V1/ΔI), and the second internal resistance R2 is calculated by dividing the voltage value V2 by the change amount ΔI of the current value (R2=V2/ΔI).

Then, based on a resistance value difference RG (see FIG. 2) obtained by subtracting the first internal resistance R1 from the second internal resistance R2, the generation of gas inside the power storage device is detected with use of a predetermined criteria.

As described above, gas is detected based on the resistance value difference RG obtained by subtracting the first internal resistance R1, which is an internal resistance immediately after the state where the voltage value (internal resistance) sharply changes, from the second internal resistance R2, which is an internal resistance in a state where the voltage value (internal resistance) is becoming constant. The inventors of the present invention found that it is possible to precisely detect the generation of gas with this method. This is presumably because the generation of gas has a small influence on the internal resistance in the state where the voltage value (internal resistance) sharply changes, and has a large influence on the internal resistance in the state where the voltage value (internal resistance) is becoming constant. It is thought that, when the resistance value difference RG is obtained, the generation of gas can be precisely detected because the influence of the generation of gas on the internal resistance can be made apparent while influences on the internal resistance by causes other than the generation of gas being suppressed (eliminated).

The following describes a specific example in which the generation of gas inside a power storage device is detected based on the resistance value difference RG.

Gas Detection Device

Figure 2:
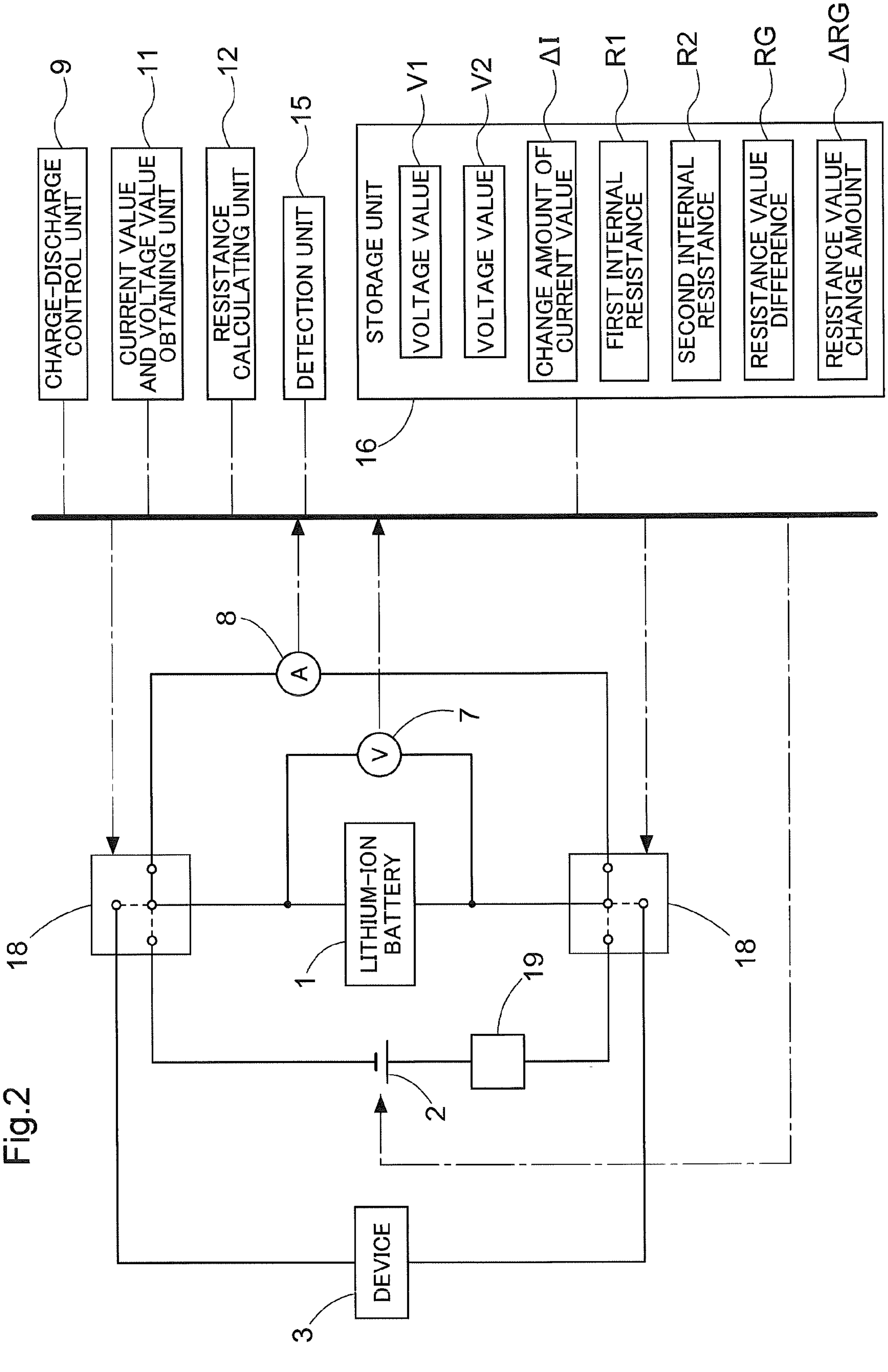
FIG. 2 is a diagram showing an example configuration for detecting generation of gas.

First, the following describes a configuration example of a gas detection device for detecting the generation of gas inside a power storage device with use of FIG. 2 while referring to FIG. 1.

A lithium-ion battery 1 is an example of a power storage device that is chargeable and dischargeable, and is charged with power supplied from a power source 2. The lithium-ion battery 1 supplies power to a device 3, which is any of various devices that consume power, by discharging the charged power.

The gas detection device includes a voltmeter 7, an ammeter 8, a charge-discharge control unit 9 (corresponding to a "current-voltage control unit"), a current value and voltage value obtaining unit 11, a resistance calculating unit 12, a detection unit 15, and a storage unit 16.

The voltmeter 7 is connected in parallel to the lithium-ion battery 1 and measures the voltage value of the lithium-ion battery 1. The ammeter 8 is connected in series to the lithium-ion battery 1 and measures the current value of the lithium-ion battery 1.

The charge-discharge control unit 9 controls the power source 2 and switches 18 to control charging and discharging of the lithium-ion battery 1 and the voltage value and the current value of the lithium-ion battery 1. When the lithium-ion battery 1 is charged, the charge-discharge control unit 9 controls the switches 18 to connect the power source 2 and the lithium-ion battery 1 in series and supply power from the power source 2 to the lithium-ion battery 1. When the lithium-ion battery 1 supplies power to the device 3 (discharging state), the charge-discharge control unit 9 controls the switches 18 to connect the lithium-ion battery 1 and the device 3 in series. Note that the lithium-ion battery 1 can also be charged with power regenerated by the device 3. In this case, the charge-discharge control unit 9 may also control the regenerative charging of the lithium-ion battery 1 by controlling the switches 18 and a charging circuit 19.

When detecting the generation of gas inside the lithium-ion battery 1, the charge-discharge control unit 9 controls the switches 18 to connect the lithium-ion battery 1 to the gas detection device. When detecting the generation of gas, a detection cycle is carried out in which the voltage value or the current value of the lithium-ion battery 1 is changed and a change in the internal resistance over time is calculated from voltage values and a current value obtained as a result of the voltage value or the current value being changed.

The current value and voltage value obtaining unit 11 obtains voltage values of the lithium-ion battery 1 measured by the voltmeter 7 and current values of the lithium-ion battery 1 measured by the ammeter 8 and stores the obtained values in the storage unit 16.

Note that the current value and voltage value obtaining unit 11 obtains the voltage value V1 and the voltage value V2 respectively corresponding to the first period of time t1 and the second period of time t2, which are different elapsed times tx from when the voltage value or the current value was changed.

The resistance calculating unit 12 calculates an internal resistance of the lithium-ion battery 1 from a voltage value and a current value stored in the storage unit 16 with use of the Ohm's law. Note that the current value used to calculate the internal resistance is a change amount ΔI of the current value when the voltage value or the current value was changed. The resistance calculating unit 12 calculates the first internal resistance R1 and the second internal resistance R2 from the voltage values V1 and V2 and stores the internal resistances R1 and R2 in the storage unit 16.

The detection unit 15 detects the generation of gas inside the lithium-ion battery 1 based on the first internal resistance R1 and the second internal resistance R2 stored in the storage unit 16 with use of a predetermined criteria.

For example, when the resistance value difference RG (R2−R1) obtained by subtracting the first internal resistance R1 from the second internal resistance R2 is larger than a predetermined threshold, the detection unit 15 determines that gas has been generated. Note that the resistance value difference RG (R2−R1) may be calculated by the resistance calculating unit 12.

Note that a configuration is also possible in which the detection cycle is carried out repeatedly (intermittently) at suitable timings, the first internal resistance R1 and the second internal resistance R2 are calculated in each detection cycle, and it is determined in each detection cycle that gas has been generated if the resistance value difference RG is larger than the predetermined threshold. Alternatively, the detection unit 15 may detect the generation of gas based on a resistance value change amount ΔRG (Δ(R2−R1)) that is a difference from a resistance value difference RG in the first detection cycle. In this case, the threshold may be calculated based on a resistance value difference RG calculated in an immediately preceding detection cycle or a detection cycle earlier than the immediately preceding detection cycle or may be the resistance value difference RG in the first detection cycle. The detection unit 15 may determine that gas has been generated in a case where the resistance value change amount ΔRG (Δ(R2−R1)), which is a difference between a resistance value difference RG calculated in each detection cycle and the resistance value difference RG in the first detection cycle, is larger than 0. As described above, it is possible to efficiently and precisely detect the generation of gas by optimum means according to the gas generating conditions or characteristics of the lithium-ion battery 1 (power storage device). Note that the resistance value change amount ΔRG (Δ(R2−R1)) may be calculated by the resistance calculating unit 12.

Gas Detection Method

Figure 3:
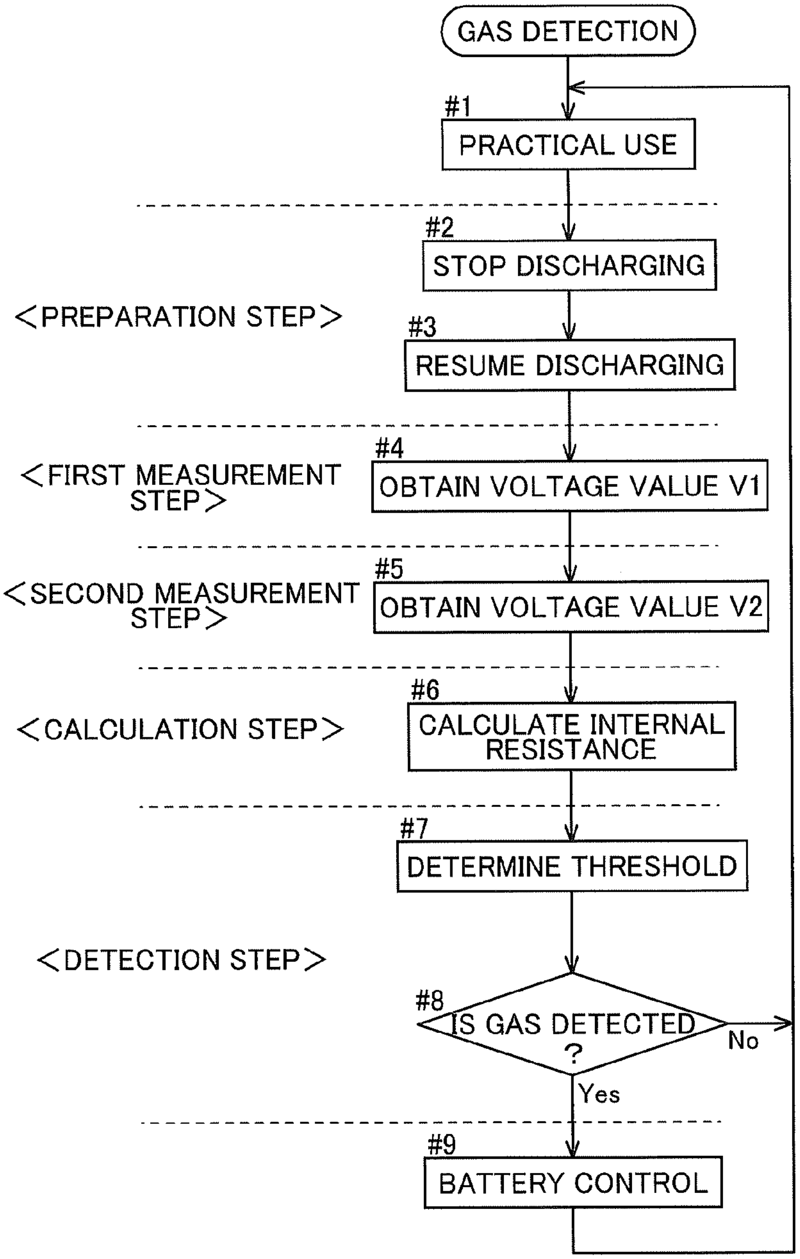
FIG. 3 is a diagram showing an example flow of a gas detection method.

Next, the following describes an example of a gas detection method with reference to FIGS. 1 to 3. The following describes an example configuration in which the detection cycle is repeated at suitable or predetermined intervals during practical use, discharging is stopped while the lithium-ion battery is discharged in the detection cycle, and the generation of gas is detected based on time dependency of the internal resistance after discharging is stopped. However, a configuration is also possible in which charging is stopped while the lithium-ion battery is charged in the detection cycle, and the generation of gas is detected based on time dependency of the internal resistance after charging is stopped. Alternatively, the generation of gas may be detected based on time dependency of the internal resistance after the voltage value or the current value is changed by a suitable method. Also, as described above, the generation of gas may be detected in a single detection cycle without the detection cycle being repeated.

First, charging of the lithium-ion battery 1 and power supply from the lithium-ion battery 1 to the device 3 are repeated. This step is called "practical use" (step #1 in FIG. 3). The detection cycle is repeated at suitable or predetermined intervals during the practical use, and the generation of gas inside the lithium-ion battery 1 is detected in the detection cycle.

In each detection cycle, first, the charge-discharge control unit 9 stops discharging while the lithium-ion battery 1 is discharged and resumes discharging. That is, discharging is stopped (step #2 in FIG. 3) while the lithium-ion battery 1 is discharged, and when a predetermined period of time has elapsed or the lithium-ion battery enters a predetermined charged state (charge capacity), discharging is resumed (step #3 in FIG. 3). Discharging may be stopped and resumed in the detection cycle at the same voltage value (charge voltage) or current value (charge current) as the voltage value or current value at which the lithium-ion battery is discharged in the practical use, or at a different voltage value (charge voltage) or current value (charge current). This step of stopping and resuming discharging is called a "preparation step". When discharging is stopped, the discharge current becomes 0, and when discharging is resumed, discharging is performed at a predetermined discharge current, and accordingly, the discharge current at which discharging is performed is the change amount ΔI of the current value. The change amount ΔI of the current value is stored in the storage unit 16. The discharge current may be obtained by the ammeter 8. Note that, instead of stopping and resuming discharging, it is possible to change the voltage value and the current value in the preparation step of the detection cycle. In this case, the charge-discharge control unit 9 functions as a current-voltage control unit. If the change amount ΔI of the current value is accurately controlled, the ammeter 8 may be omitted from the gas detection device.

In each detection cycle, the current value and voltage value obtaining unit 11 obtains a voltage value V0 of the time when discharging is stopped. Furthermore, the current value and voltage value obtaining unit 11 obtains a voltage value corresponding to a first period of time t1 when 1 second has elapsed from when discharging was stopped (step #4 in FIG. 3), and obtains a voltage value corresponding to a second period of time t2 when 60 seconds have elapsed from when discharging was stopped (step #5 in FIG. 3).

Then, the current value and voltage value obtaining unit 11 stores a potential difference between the voltage value corresponding to the first period of time t1 and the voltage value V0 as a voltage value V1 corresponding to the first period of time t1, in the storage unit 16, and stores a potential difference between the voltage value corresponding to the second period of time t2 and the voltage value V0 as a voltage value V2 corresponding to the second period of time t2, in the storage unit 16.

Next, the resistance calculating unit 12 calculates a first internal resistance R1, which is an internal resistance of the lithium-ion battery 1 corresponding to the first period of time t1, by dividing the voltage value V1 by the change amount ΔI of the current value, and calculates a second internal resistance R2, which is an internal resistance of the lithium-ion battery 1 corresponding to the second period of time t2, by dividing the voltage value V2 by the change amount ΔI of the current value. The step from obtaining the voltage value corresponding to the first period of time t1 to calculating the first internal resistance R1 is called a "first measurement step", and the step from obtaining the voltage value corresponding to the second period of time t2 to calculating the second internal resistance R2 is called a "second measurement step". In the first measurement step and the second measurement step, the voltage values may be measured and the first internal resistance R1 and the second internal resistance R2 may be calculated from the measured voltage values, but a configuration is also possible in which the first internal resistance R1 corresponding to the first period of time t1 and the second internal resistance R2 corresponding to the second period of time t2 are directly measured. In this case, the voltmeter 7 may be omitted from the gas detection device.

Then, the resistance calculating unit 12 calculates a resistance value difference RG by subtracting the first internal resistance R1 from the second internal resistance R2. Furthermore, the resistance calculating unit 12 calculates a resistance value change amount ΔRG by subtracting a resistance value difference RG calculated in the first detection cycle from the resistance value difference RG calculated in this detection cycle (step #6 in FIG. 3). This step is called a "calculation step".

Next, the detection unit 15 determines a threshold for detecting the generation of gas inside the lithium-ion battery 1 (step #7 in FIG. 3). The threshold is determined based on a resistance value change amount ΔRG or a resistance value difference RG calculated in an immediately preceding detection cycle or a detection cycle earlier than the immediately preceding detection cycle. Note that the threshold may be set to a predetermined value in advance.

Then, the detection unit 15 compares the resistance value change amount ΔRG and the determined threshold and determines whether or not the resistance value change amount ΔRG is larger than the threshold (step #8 in FIG. 3). If the resistance value change amount ΔRG is larger than the threshold, the detection unit 15 determines that gas has been generated inside the lithium-ion battery 1. This step is called a "detection step".

If the resistance value change amount ΔRG is larger than the threshold (the generation of gas is detected) (Yes in step #8 in FIG. 3), the method for using the lithium-ion battery 1 or the method for charging the lithium-ion battery 1 is controlled to suppress the generation of gas, and the lithium-ion battery is practically used (step #9 in FIG. 3). If the resistance value change amount ΔRG is equal to or smaller than the threshold (No in step #8 in FIG. 3), gas has not been generated, and therefore, the lithium-ion battery is practically used in the same manner as before.

Experimental Results

Next, the following describes results of an experiment in which the generation of gas inside the lithium-ion battery 1 was detected with use of the resistance value difference RG, with use of FIGS. 4 to 8 while referring to FIG. 1

The experiment was carried out with use of a rectangular lithium-ion battery 1 with a capacity of 2270 mAhm [size: 33.8 mm×48.5 mm×10.5 mm, rated charge voltage: 4.2 V, standard charge current: 1589 mAh (0.7 CA)]. A charge-discharge cycle (CC charging) was performed on the lithium-ion battery 1 in a thermostatic bath at 50° C. at a charge voltage of 4.2 V, a discharge voltage of 2.7 V, and a current of 0.7 CA assuming practical use.

The detection cycle was carried out before the charge-discharge cycle and when 1, 2, 3, 5, 7, 10, and 14 weeks elapsed while the charge-discharge cycle was performed. In each detection cycle, the lithium-ion battery was charged and discharged at a charge voltage of 4.2 V, a discharge voltage of 2.7 V, and a current of 0.2 CA in an environment at 25° C. to confirm the capacity (this capacity will be referred to as a "confirmed capacity"), and then discharged in the detection cycle, and discharging was stopped and then resumed. From time dependency of the resistance in a state where SOC was approximately 90%, a voltage value V1 corresponding to a first period of time t1 was determined when 1 second had elapsed from when discharging was stopped, and a voltage value V2 corresponding to a second period of time t2 was determined when 60 seconds had elapsed from when discharging was stopped. Also, a first internal resistance R1 (R1: 1-second resistance) and a second internal resistance R2 (R60: 60-seconds resistance) were determined from the charge current, the voltage value V1, and the voltage value V2, and a resistance value difference RG (R60−R1) and a resistance value change amount ΔRG (Δ(R60−R1)) were calculated. Also, a difference ΔR1 between the first internal resistance R1 (R1) in this detection cycle and a first internal resistance R1 calculated in the first detection cycle and a difference ΔR60 between the second internal resistance R2 (R60) in this detection cycle and a second internal resistance R2 calculated in the first detection cycle were calculated. Furthermore, the volume of the lithium-ion battery 1 was measured with use of Archimedes' method, and a gas generation amount was measured by subtracting the volume of the lithium-ion battery 1 prior to the charge discharge cycle. AC impedance (SOC approximately 100%) was also measured for confirmation, and a bulk resistance was determined from an x-axis intercept of the Nyquist plot of AC impedance, and a reaction resistance was determined from an arc portion of the plot.

Figure 5:
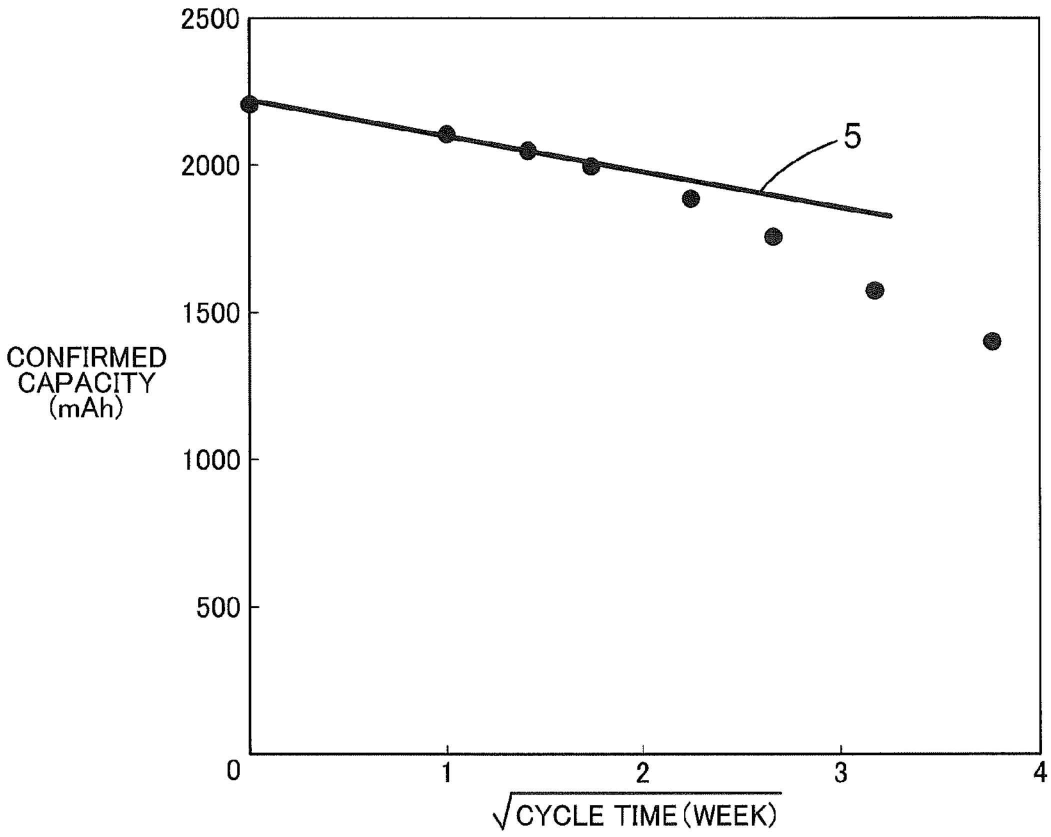
FIG. 5 is a diagram showing a transition of capacity deterioration over time based on an experimental result and a theoretical transition of capacity deterioration over time in a state where gas is not generated.
Figure 6:
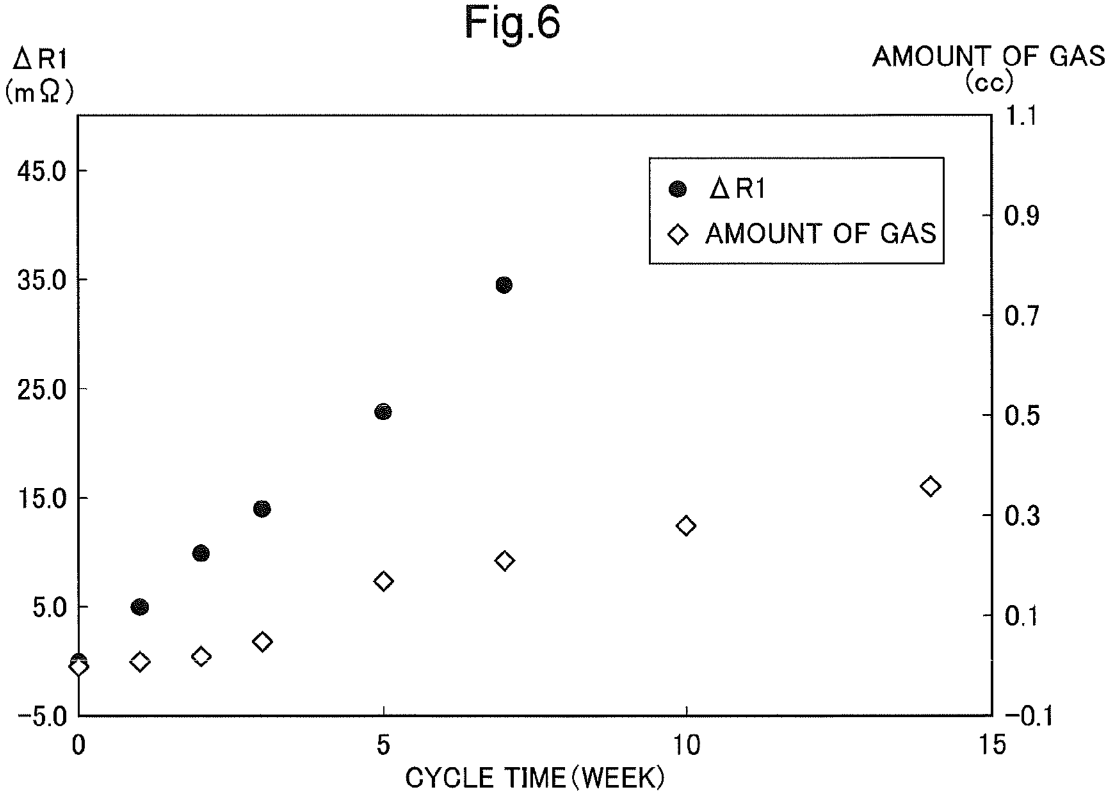
FIG. 6 is a diagram showing change of a first internal resistance over time and change of a gas generation amount over time.
Figure 7:
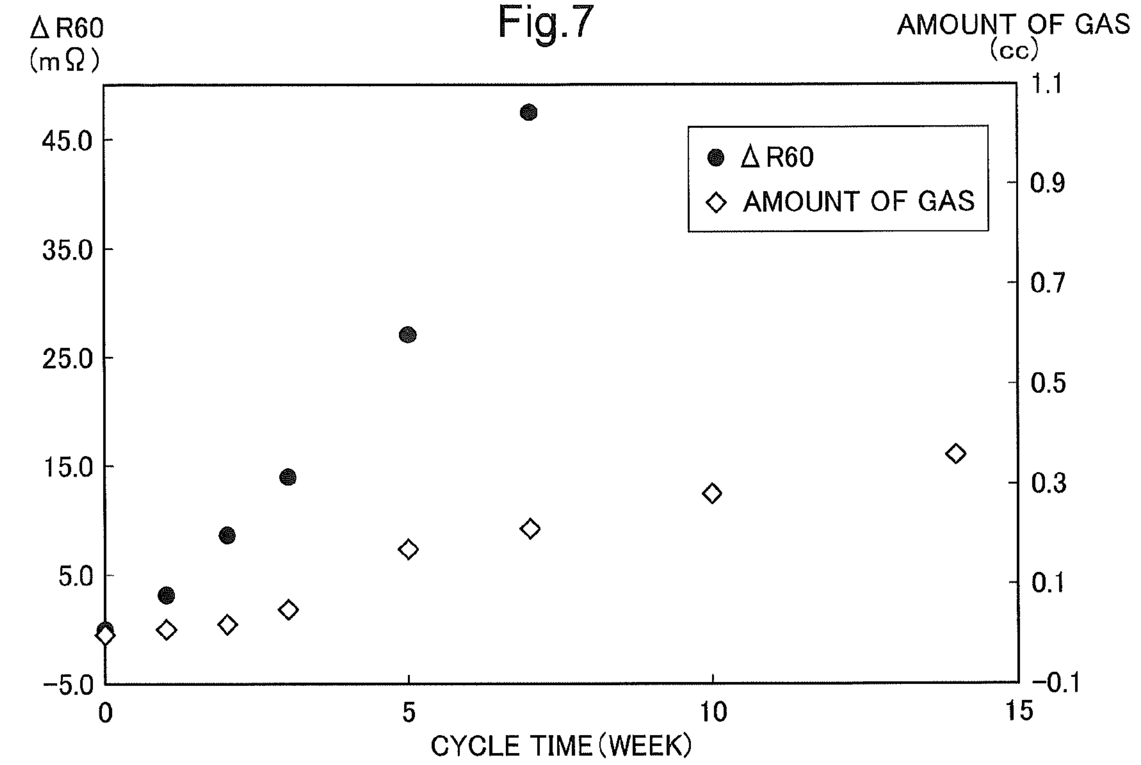
FIG. 7 is a diagram showing change of a second internal resistance over time and change of the gas generation amount over time.
Figure 8:
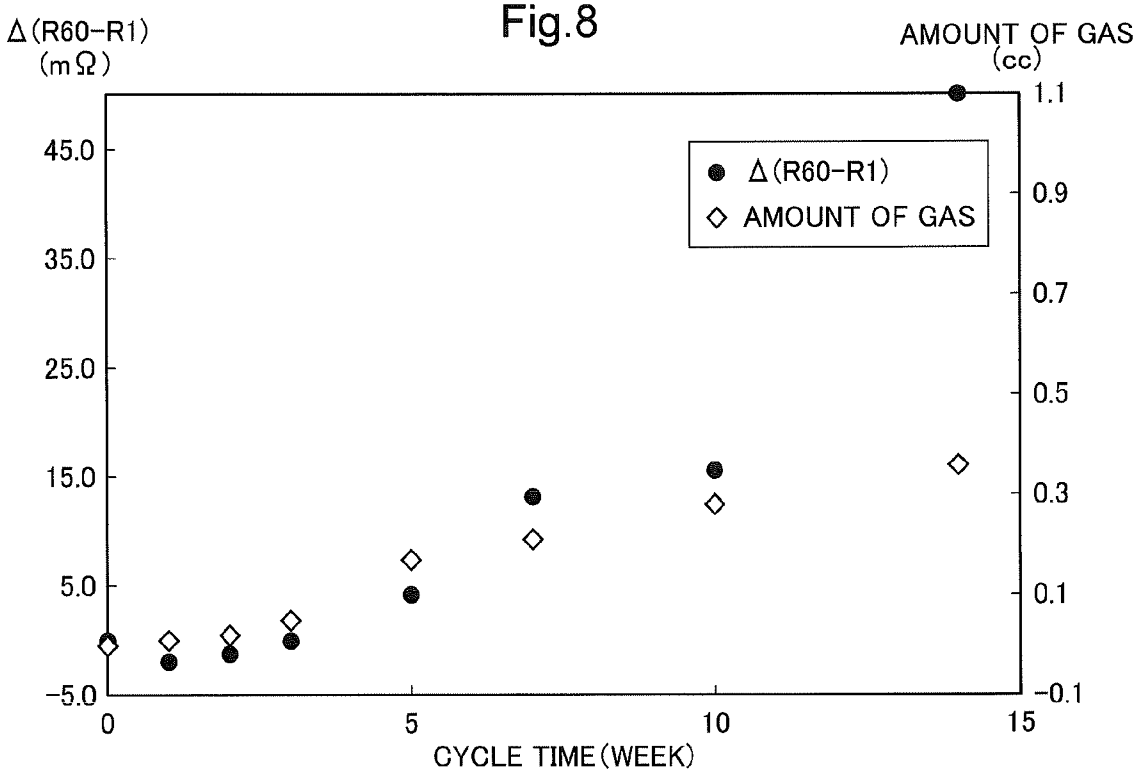
FIG. 8 is a diagram showing change of a resistance value change amount over time and change of the gas generation amount over time.

FIG. 4 is a table showing values actually measured in the experiment. As shown in FIG. 4, it can be found that generation of gas started when the cycle time was 3 to 5 weeks. Also, as shown in FIG. 5, it can be found that the confirmed capacity of the lithium-ion battery 1 deteriorated when the cycle time was 3 to 5 weeks relative to the line 5 showing a theoretical transition of capacity deterioration over time in a state where gas is not generated, and it can be supposed that gas was generated when the cycle time was 3 to 5 weeks.

As shown in FIG. 4, the first internal resistance R1 (R1), the difference ΔR1 between the first internal resistance R1 (R1) calculated in each detection cycle and the first internal resistance R1 (R1) calculated in the first detection cycle, the second internal resistance R2 (R60), and the difference ΔR60 between the second internal resistance R2 (R60) calculated in each detection cycle and the second internal resistance R2 (R60) calculated in the first detection cycle increased even when gas was not generated. This is also apparent from FIG. 6, which shows a divergence between the transition of ΔR1 over time and the transition of the amount of actually generated gas over time, and also apparent from FIG. 7, which shows a divergence between the transition of ΔR60 over time and the transition of the amount of actually generated gas over time. Therefore, it is difficult to detect the generation of gas based on the first internal resistance R1, the difference ΔR1 between the first internal resistance R1 calculated in each detection cycle and the first internal resistance R1 calculated in the first detection cycle, the second internal resistance R2, and the difference ΔR60 between the second internal resistance R2 calculated in each detection cycle and the second internal resistance R2 calculated in the first detection cycle.

On the other hand, as shown in FIG. 4, the resistance value change amount ΔRG (Δ(R60−R1)) obtained by subtracting a resistance value difference RG (R60−R1) in the first detection cycle from the resistance value difference RG (R60−R1) calculated in each detection cycle and the resistance value difference RG (R60−R1) increase with an increase in the amount of gas. Also, in FIG. 8, the transition of the resistance value change amount ΔRG (Δ(R60−R1)) over time substantially matches with the transition of the amount of actually generated gas over time. Therefore, it can be found that the generation of gas can be easily detected by calculating the resistance value difference RG and the resistance value change amount ΔRG. Note that, in FIGS. 4 and 8, it appears that the resistance value change amount ΔRG (Δ(R60−R1)) diverges from the amount of gas in the 14th week, but this is because the amount of generated gas became too large, the volume change of the lithium-ion battery 1 was restricted due to the lithium-ion battery 1 being bound, and the amount of gas could not be measured accurately.

Control of Battery

When the generation of gas in the lithium-ion battery 1 is detected as described above, it is appropriate to control the battery. That is, it is appropriate to use the maximum battery capacity until gas is generated, and when the generation of gas is detected, perform battery control such as charge discharge control of the lithium-ion battery 1 in view of the resistance value difference RG and the resistance value change amount ΔRG to suppress the generation of gas. As a result, it is possible to suppress secondary deterioration due to the generation of gas or an increase in the amount of gas, increase the service life of the battery, and increase a total discharge amount (e.g., a total travel distance of an electric vehicle).

In the experimental results described above, the generation of gas started in 3 to 5 weeks. Based on this, an experiment was further carried out regarding battery control. In this experiment, a charge-discharge cycle was performed on five batteries at a charge voltage of 4.2 V, a discharge voltage of 2.7 V, and a current of 0.7 CA (CC charging) for 4 weeks in a thermostatic bath at 50° C., thereafter the cycle was changed by changing the charge voltage to 4.1 V, 4.05 V, or 4.0 V, or by performing constant current constant voltage charging (CCCV charging) at a charge voltage of 4.1 V until the current decreased to 1/20 CA, or by performing constant current constant voltage charging (CCCV charging) at a charge voltage of 4.0 V until the current decreased to 1/20 CA, and the changed cycle was repeated.

Figure 9:
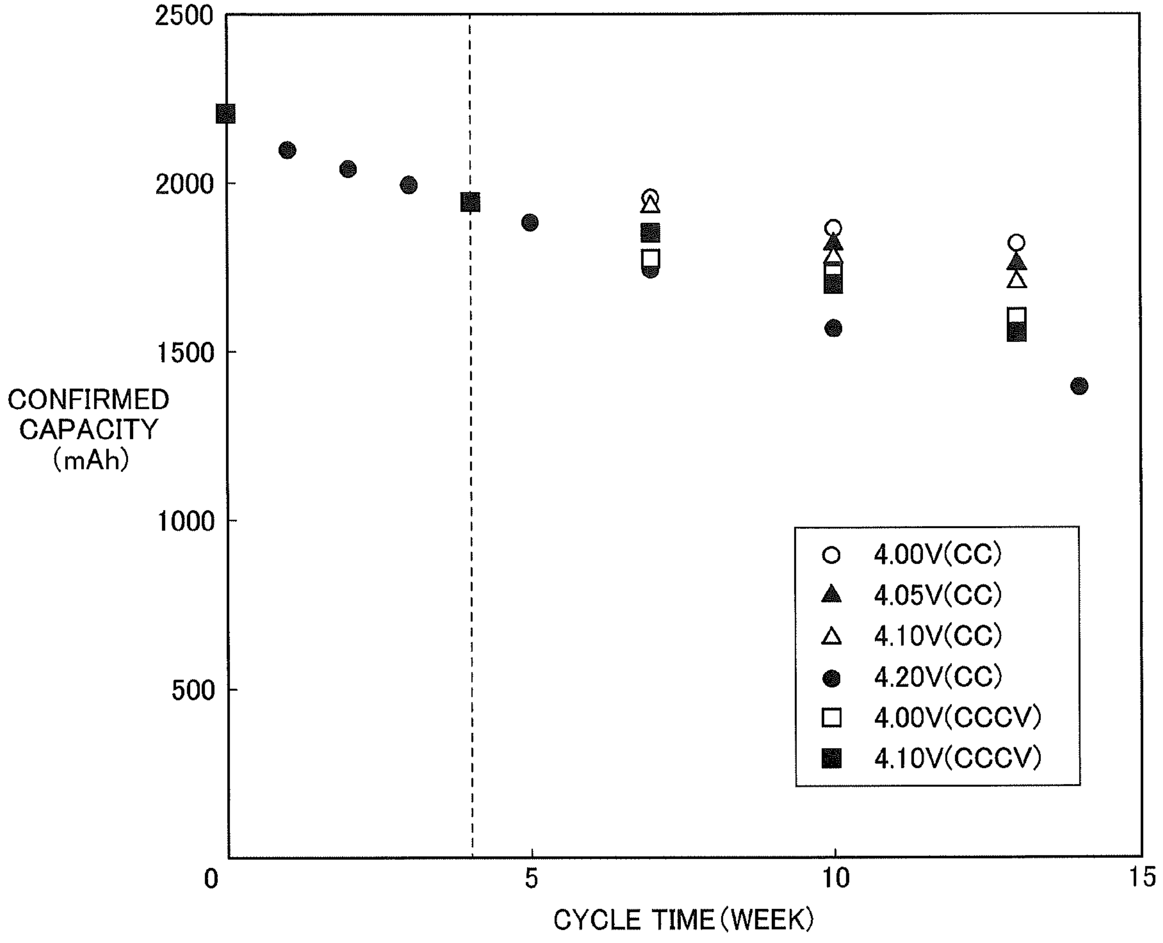
FIG. 9 is a diagram showing an example of improvements in capacity deterioration as a result of battery control being changed.

As shown in FIG. 9, it can be found that, in all of the cases where the batteries were appropriately charged and discharged by performing battery control, the confirmed capacity increased and the service life of the batteries increased compared with the case where no change was made from the control performed at the charge voltage of 4.2 V, the discharge voltage of 2.7 V, and the current of 0.7 CA (CC charging). When the charge voltage is reduced, a charge discharge amount in each cycle naturally decreases. However, in the case where charging was performed at 4.0 V, for which the highest capacity retention rate was achieved, a total discharge amount was 1581 Ah and the capacity retention rate was 82.9% in the 7th week, whereas in the case where the charging and discharging method was not changed, a total discharge amount was 841 Ah and the capacity retention rate was 79.5% in the 7th week, and this shows an effect of approximately doubling the service life.

The battery control may be performed by changing the temperature at which the battery is charged and discharged or by changing use conditions such as the temperature during use of the lithium-ion battery 1, instead of changing the charge voltage or reducing (attenuating) the charge current and performing constant current constant voltage charging when charging and discharging the battery.

Other Embodiments (1) The first period of time t1 is not limited to 1 second, and is only required to be longer than the period during which the initial voltage value sharply increases. For example, the first period of time t1 may be a period of time in which the internal resistance becomes a predetermined value that is 10% or more and 40% or less of an internal resistance in the steady state. Specifically, in the case of the lithium-ion battery 1, the first period of time t1 may be 10 milliseconds or more and 5 seconds or less, and more preferably 10 milliseconds or more and 3 seconds or less. Also, the second period of time t2 is not limited to 60 seconds. It is only required that the second period of time is longer than the first period of time t1 and the internal resistance becomes sufficiently constant within the second period of time. For example, the second period of time t2 may be a period of time in which the internal resistance becomes a predetermined value that is 80% or more of the internal resistance in the steady state. Specifically, in the case of the lithium-ion battery 1, the second period of time t2 may be 5 seconds or more and 600 seconds or less.

In this case, it is possible to calculate an appropriate resistance value difference RG and an appropriate resistance value change amount ΔRG, and precisely detect the generation of gas.

(2) In each embodiment described above, the preparation step may be distinguished from the practical use and performed separately in the detection cycle as described above, but charging and discharging in the practical use may be taken as the preparation step. That is, the current value or the voltage value also changes when the lithium-ion battery 1 (secondary battery) is actually used. For example, during the practical use, the current value or the voltage value changes when the battery transitions from a discharged state to a stopped state, and also changes when the battery transitions from the stopped state to the discharged state. Therefore, the state where the current value or the voltage value changes as described above during charging or discharging in the practical use may be taken as the preparation step, and the remaining steps of the detection cycle may be executed when the current value or the voltage value changes. In this case, it is possible to efficiently and precisely detect the generation of gas inside the lithium-ion battery 1.

(3) In each embodiment described above, each detection cycle is preferably carried out while the lithium-ion battery 1 is kept within a predetermined temperature range. The first period of time t1, the second period of time t2, and the relationship between the threshold and the resistance value difference RG or the resistance value change amount ΔRG are determined based on the temperature range. Conversely, the time dependency of internal resistance depends on the temperature, and therefore, if the temperature of the environment in which the detection cycle is carried out varies, the relationship between the threshold and the resistance value difference RG or the resistance value change amount ΔRG may be corrected in accordance with the temperature of the environment in which the detection cycle is carried out.

In this case, it is possible to appropriately set various conditions, and stably and precisely detect the generation of gas inside the lithium-ion battery 1.

(4) In each embodiment described above, it is possible to detect gas not only in the lithium-ion battery 1 but also in any power storage device that is chargeable and dischargeable, such as various secondary batteries.

(5) In each embodiment described above, the gas detection device is not limited to a device constituted by the functional blocks shown in FIG. 2, and may also be constituted by suitable functional blocks. For example, each functional block of the gas detection device may be further divided, or conversely, some or all of the functional blocks may be integrated. Also, the gas detection method described above may be executed not only by the gas detection device shown in FIG. 2, but also by a gas detection device having a suitable configuration. Also, some or all functions of the gas detection device may be constituted by software. A program relating to the software is stored in a suitable storage device, and is executed by a processor, such as a CPU, included in the gas detection device, or a processor provided separately from the gas detection device.

Note that the configurations disclosed in the above embodiments (including the other embodiments, the same applies hereinafter) can be applied in combination with configurations disclosed in other embodiments unless no contradiction arises. Also, the embodiments disclosed in the present specification are examples, and embodiments of the present invention are not limited to those embodiments, and can be modified as appropriate within a scope not departing from the object of the present invention.

INDUSTRIAL APPLICABILITY

The present invention can be applied to detection of gas generated in a lithium-ion battery, as well as various power storage devices.

DESCRIPTION OF REFERENCE SIGNS

1: lithium-ion battery (power storage device)
9: charge-discharge control unit (current-voltage control unit)
11: current value and voltage value obtaining unit
12: resistance calculating unit
15: detection unit
16: storage unit
R1: first internal resistance
R2: second internal resistance
RG: resistance value difference
t0: elapsed time
t1: first period of time
t2: second period of time
tx: elapsed time
V0: voltage value
V1: voltage value
V2: voltage value
Vr: constant voltage
ΔI: change amount of current value
ΔRG: resistance value change amount

The invention claimed is:

1. A gas detection method comprising:

a preparation step of changing a current value or a voltage value of a power storage device;

a first measurement step of obtaining a first internal resistance that is an internal resistance when a predetermined first period of time has elapsed from start of change in the current value or the voltage value in the preparation step;

a second measurement step of obtaining a second internal resistance that is an internal resistance when a second period of time has elapsed from the start of change in the current value or the voltage value in the preparation step, the second period of time being longer than the first period of time by at least a predetermined period of time;

a calculation step of calculating a resistance value difference by subtracting the first internal resistance from the second internal resistance; and a detection step of detecting generation of gas in the power storage device based on the resistance value difference;

wherein the first and second periods of time are derived from a single waveform obtained from the change of the current value or voltage value.

2. The gas detection method according to claim 1, wherein the current value or the voltage value is changed in the preparation step by stopping charging while the power storage device is charged or by stopping discharging while the power storage device is discharged.

3. The gas detection method according to claim 1, wherein, when the resistance value difference is larger than a predetermined threshold determined in advance, it is determined in the detection step that the gas has been generated.

4. The gas detection method according to claim 1, wherein a detection cycle including the preparation step, the first measurement step, the second measurement step, the calculation step, and the detection step is carried out intermittently, and wherein in each detection step, when the resistance value difference is larger than a predetermined threshold determined in advance, it is determined in the detection step that the gas has been generated.

5. The gas detection method according to claim 4, wherein, in each detection step, the threshold is calculated based on the resistance value difference calculated in an immediately preceding detection cycle or a detection cycle earlier than the immediately preceding detection cycle.

6. The gas detection method according to claim 4, wherein the threshold is the resistance value difference in the first detection cycle.

7. The gas detection method according to claim 1, wherein a detection cycle including the preparation step, the first measurement step, the second measurement step, the calculation step, and the detection step is carried out intermittently, and wherein in each detection step, when a value obtained by subtracting the resistance value difference calculated in the first detection cycle from the resistance value difference calculated in the detection cycle is larger than 0, it is determined in the detection step that the gas has been generated.

8. The gas detection method according to claim 1, wherein the second period of time is set to a period of time in which the internal resistance becomes a predetermined value that is 80% or more of an internal resistance in a steady state after the preparation step is started.

9. The gas detection method according to claim 8, wherein the first period of time is set to a period of time in which the internal resistance becomes a predetermined value that is 10% or more and 40% or less of the internal resistance in the steady state after the preparation step is started.

10. The gas detection method according to claim 1, wherein the first period of time is set to 10 milliseconds or more and 3 seconds or less, and wherein the second period of time is set to 5 seconds or more and 600 seconds or less.

11. The gas detection method according to claim 1, wherein the preparation step, the first measurement step, the second measurement step, the calculation step, and the detection step are carried out while the power storage device is kept in a predetermined temperature range.

12. A gas detection device configured to detect generation of gas in a power storage device that is chargeable and dischargeable, the gas detection device comprising:

a current-voltage control unit configured to control at least a current value or a voltage value of the power storage device;

a voltmeter configured to measure the voltage value of the power storage device;

an ammeter configured to measure a current value of a current flowing through the power storage device;

a resistance calculating unit configured to measure a first internal resistance that is an internal resistance of the power storage device and a second internal resistance that is an internal resistance of the power storage device, the first internal resistance being measured from: a change amount of the voltage value until a predetermined first period of time elapses from when the current value or the voltage value of the power storage device is changed; and a change amount of the current value when the current value or the voltage value is changed, the second internal resistance being measured from: a change amount of the voltage value until a second period of time longer than the first period of time by a predetermined period of time elapses from when the current value or the voltage value is changed; and the change amount of the current value when the current value or the voltage value is changed; and a detection unit configured to calculate a resistance value difference by subtracting the first internal resistance from the second internal resistance and detect generation of gas in the power storage device based on the resistance value difference;

wherein the first and second periods of time are derived from a single waveform obtained from the change of the current value or voltage value.

* * * * *